(12) United States Patent
Cho et al.

(10) Patent No.: US 7,009,545 B2
(45) Date of Patent: Mar. 7, 2006

(54) SEMICONDUCTOR DEVICE HAVING ON-CHIP REFERENCE VOLTAGE GENERATOR

(75) Inventors: Young-Jae Cho, Pyeongtaek-si (KR); Seung-Hoon Lee, Seoul (KR)

(73) Assignee: Hynix Semiconductor Inc., (KR)

(*) Notice: Subject to any disclaimer, the term of this patent is extended or adjusted under 35 U.S.C. 154(b) by 0 days.

(21) Appl. No.: 10/750,078

(22) Filed: Dec. 31, 2003

(65) Prior Publication Data

US 2005/0110670 A1 May 26, 2005

(30) Foreign Application Priority Data

Nov. 26, 2003 (KR) ............... 10-2003-0084388

(51) Int. Cl.
H03M 1/12 (2006.01)
G05F 3/16 (2006.01)
G05F 3/20 (2006.01)
G05F 1/10 (2006.01)
G05F 3/02 (2006.01)

(52) U.S. Cl. .............. 341/155; 323/313; 327/540
(58) Field of Classification Search ............ 341/158, 341/155, 161, 118, 120, 136, 159; 327/530, 327/535, 537, 540; 323/313, 314, 316
See application file for complete search history.

(56) References Cited

U.S. PATENT DOCUMENTS

| | | | |
|---|---|---|---|
| 5,280,200 A * | 1/1994 | Tarng | 327/312 |
| 5,280,455 A * | 1/1994 | Kanaishi | 365/229 |
| 5,376,840 A * | 12/1994 | Nakayama | 327/537 |
| 5,399,960 A * | 3/1995 | Gross | 323/313 |
| 5,570,004 A * | 10/1996 | Shibata | 323/303 |
| 5,642,072 A * | 6/1997 | Miyamoto et al. | 327/535 |
| 5,686,825 A * | 11/1997 | Suh et al. | 323/316 |
| 5,721,702 A * | 2/1998 | Briner | 365/185.21 |
| 5,877,615 A * | 3/1999 | Wang et al. | 323/313 |
| 5,886,657 A * | 3/1999 | Ahuja | 341/144 |
| 6,034,519 A * | 3/2000 | Yang | 323/316 |
| 6,281,828 B1 * | 8/2001 | Kimura et al. | 341/155 |
| 6,366,155 B1 * | 4/2002 | Moon et al. | 327/530 |
| 6,459,628 B1 * | 10/2002 | Bautista et al. | 365/194 |
| 6,486,820 B1 * | 11/2002 | Allworth et al. | 341/161 |
| 6,534,806 B1 * | 3/2003 | Wert | 257/213 |
| 6,542,026 B1 * | 4/2003 | Wu et al. | 327/540 |
| 6,567,028 B1 * | 5/2003 | Huang et al. | 341/155 |
| 6,570,367 B1 * | 5/2003 | Bartenschlager et al. | 323/269 |
| 6,657,484 B1 * | 12/2003 | Bosshart | 327/558 |
| 6,700,407 B1 * | 3/2004 | Wert | 326/81 |
| 6,751,134 B1 * | 6/2004 | Choi et al. | 365/189.11 |
| 6,791,308 B1 * | 9/2004 | Shim | 323/314 |
| 6,867,639 B1 * | 3/2005 | Chun | 327/538 |

FOREIGN PATENT DOCUMENTS

JP  11-202958  7/1999

* cited by examiner

*Primary Examiner*—Patrick Wamsley
(74) *Attorney, Agent, or Firm*—Blakely, Sokoloff Taylor & Zafman

(57) ABSTRACT

A analog to digital converter is implemented in one chip. The one chip analog to digital converter includes an on-chip reference voltage generator for generating N number of reference voltages, N being a positive integer; and a conversion means for converting the inputted analog signal into a digital signal by using the reference voltages.

28 Claims, 10 Drawing Sheets

SEMICONDUCTOR DEVICE HAVING ON-CHIP REFERENCE VOLTAGE GENERATOR

FIELD OF THE INVENTION

The present invention relates to a semiconductor device; and, more particularly, to an analog to digital converter (A/D converter) having an on-chip reference voltage generator.

DESCRIPTION OF PRIOR ART

With the recent advance of CMOS VLSI technologies and digital signal processing techniques, high-definition video systems, next-generation personal mobile communication equipments, high-speed wireless networks, and medical imaging systems increasingly need high-resolution high-speed low-power A/D converters (hereinafter, referred to ADCs). Particularly, the ADCs for flat-panel displays, digital data storage read channels, medical imaging, and RGB graphic applications require at least 8-bit resolution and 200 MS/s performance with small chip area and low power consumption. Most of the conventional ADCs with a sampling rate exceeding 200 MS/s have been commonly based on flash, folding, subranging, and pipeline architectures. In this work, the pipeline architecture is employed to optimize speed, power consumption, and chip area.

FIG. 1 is a block diagram showing a conventional ADC.

As shown, the conventional ADC includes a sample and hold amplifier (hereinafter, referred to SHA) 11, first and second multiplying digital to analog converters 13 and 15 (hereinafter, referred to MDACS), first to third unit analog to digital converters 12, 14 and 16 (hereinafter, referred to UADCs), a digital correction logic 17 (hereinafter, referred to DCL) and a decimator 18 (hereinafter, referred to DCM).

In detail, the SHA 11 receiving an analog signal AIN is used for sampling of the inputted analog signal. The first to third UADCs 12, 14 and 16 respectively convert a sampling signal into a first-step digital code. Each of the first and second MDACs 13 and 15 converts each of the first-step digital codes outputted from the first to second UADCs into each of returned analog signals; subscribes the sampling signal by the returned analog signal; and, then, outputs a resultant signal to the second or third UADC 12, 14 and 16. After the sampling signal is converted into the first-step digital codes by the first to third UADCs 12, 14 and 16, the DCL 17 combines the first-step digital codes and outputs an 8-bit second-step digital code to the DCM. Lastly, the DCM 18 serves as sampling the 8-bit second-step digital code by ½ or ¼ sampling rate. In addition, though there is not shown in FIG. 1, the conventional ADC uses an external clock signal or generates an internal clock signal in order to controlling the internal blocks described above.

Hereinafter, the operation of the conventional ADC is described in detail.

First of all, the analog signal AIN is inputted to the conventional ADC and is sampled into the sampling signal by the SHA 11. Then, the first UADC 12 compares the sampling signal outputted from the SHA 11 with a reference voltage inputted from an external circuit and generates a first 3-bit first-step digital code.

Next, the first MDAC 13 converts the first 3-bit first-step digital code outputted from the first UADC 12 into a first returned analog signal. Then, the sampling signal is subscribed by the first returned analog signal. As a result, the first MDAC 13 can get a minute analog signal. The minute analog signal is amplified and outputted to the second UADC 14 and the second MDAC 15.

Then, like the first UADC 12, the second UADC 14 generates a second 3-bit first-step digital code. The second MDAC 15 is also operated like the first MDAC 13, and the third UADC 16 converts an outputted signal of the second MDAC 15 into a third 4-bit first-step digital code.

Next, the DCL 17 receives the first to third first-step digital codes outputted from the first to third UADC 12, 14 and 16. For removing nonlinearity errors, e.g., an offset voltage generated at an analog to digital conversion process, the DCL 17 superposes each of the last bit of the first 3-bit first-step digital code and the first bit of the second 3-bit first-step digital code upon each of the last bit of the second 3-bit first-step digital code and the first bit of the third 4-bit first-step digital code.

The conventional ADC uses the reference voltage in the operational step of converting an analog signal into a digital code or the digital code into the analog signal. In the conventional ADC, the reference voltage is supplied from an external circuit. If a reference voltage generator is in the external circuit, there is a filter between the reference voltage generator and the conventional ADC chip in order to stabilizing the reference voltage, i.e., removing a noise and a glitch generated by parasitic inductance and capacitance of a wire boning and an impedance of the conventional ADC chip.

In addition, for removing the noise and the glitch, capacitance of a capacitor included in the filter should be relatively large. As a result, because a size of the capacitor is enlarged in proportion to its capacitance, it is impossible that the reference voltage generator and the conventional ADC are encased in one chip.

SUMMARY OF THE INVENTION

It is, therefore, an object of the present invention to provide a semiconductor device which stabilizes a reference voltage by eliminating high frequency noise and glitch and has the advantages of a size and an operating speed.

In accordance with an aspect of the present invention, there is provided an analog to digital converter implemented in one chip including an on-chip reference voltage generator for generating N number of reference voltages, N being a positive integer; and a conversion means for converting the inputted analog signal into a digital signal by using the reference voltages.

In accordance with another aspect of the present invention, there is provided a system having one chip analog to digital converter including an on-chip reference voltage generator contained in the analog to digital converter for generating N number of reference voltages, N being a positive integer; and a conversion block contained in the analog to digital converter for converting the inputted analog signal into a digital signal by using the reference voltages.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an analog to digital converter (A/D converter) having an on-chip reference voltage generator according to the present invention will be described in detail referring to the accompanying drawings.

Figure 2:
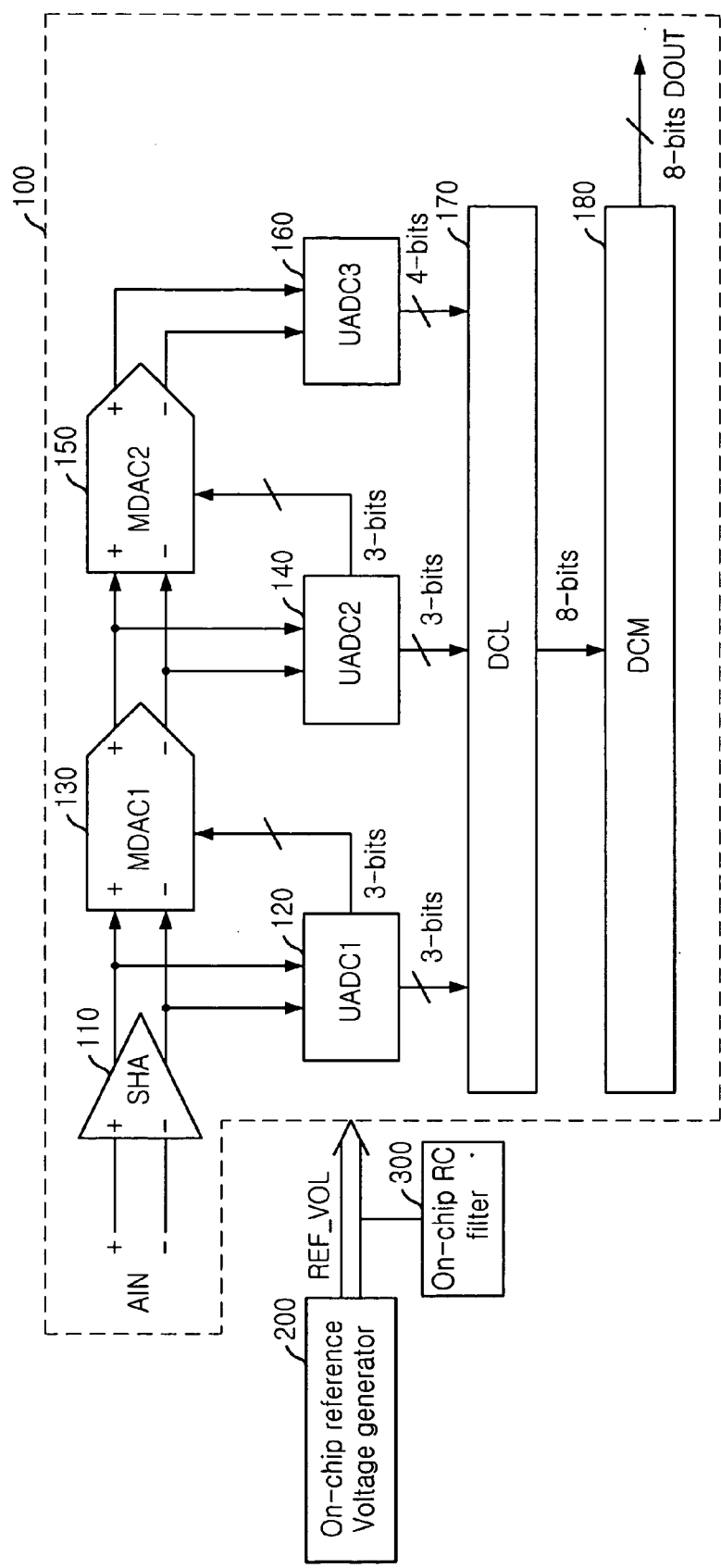
FIG. 2 is a block diagram showing an ADC in accordance with the present invention.

FIG. 2 is a block diagram showing an analog to digital converter (hereinafter, referred to ADC) in accordance with the present invention.

As shown, the ADC is provided with an on-chip reference voltage generator 200 for supplying a reference voltage REF_VOL, an on-chip RC filter 300 for stabilizing the reference voltage REF_VOL and a conversion unit 100 for converting an analog signal AIN into an 8-bit digital signal DOUT.

Figure 1:
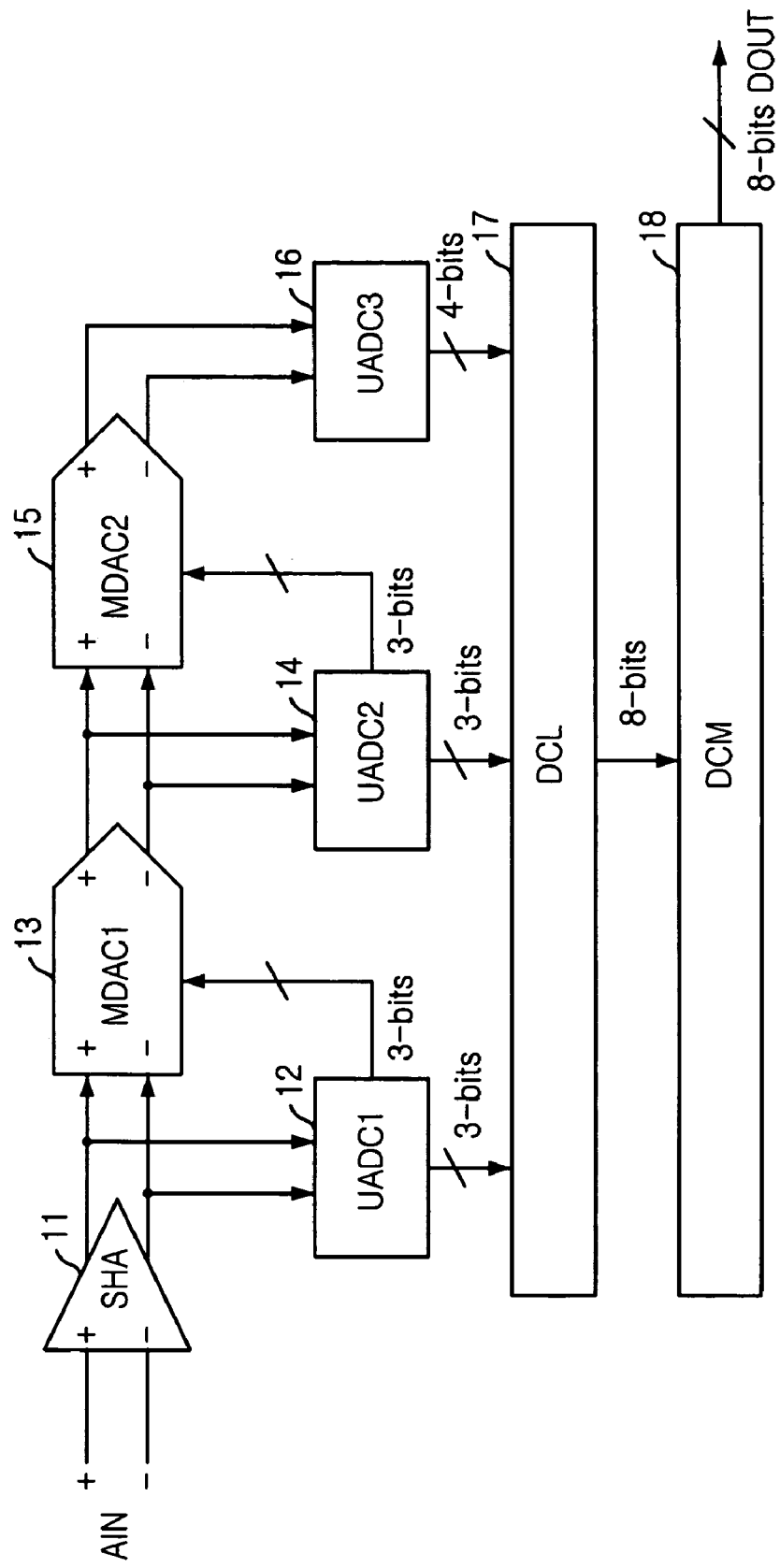
FIG. 1 is a block diagram showing a conventional analog to digital converter (ADC)

The conversion unit 100 has the same structure with the conventional ADC shown in FIG. 1. Namely, the conversion unit 100 includes a sample and hold amplifier (hereinafter, referred to SHA) 110, first and second multiplying digital to analog converters 130 and 150 (hereinafter, referred to MDACs), first to third unit analog to digital converters 120, 140 and 160 (hereinafter, referred to UADCS), a digital correction logic 170 (hereinafter, referred to DCL) and a decimator 180 (hereinafter, referred to DCM). Thus, there is omitted a detailed description of structure and its operational steps.

However, for supplying the stable reference voltage, the ADC of the present invention impounds the on-chip reference voltage generator 200 and the conversion unit 100 in one chip. Moreover, the on-chip RC filter 300 is included in the same chip. As a result, because the reference voltage REF_VOL is generated inside the chip, integrity of the reference voltage REF_VOL is dramatically advanced. In attachment, unlike the prior art, the ADC of the present invention can be fabricated by a flip-chip packaging method as well as not a wire-bonding packaging method. Thus, integrity of the analog signal inputted to the SHA 110 is advanced.

Figure 3:
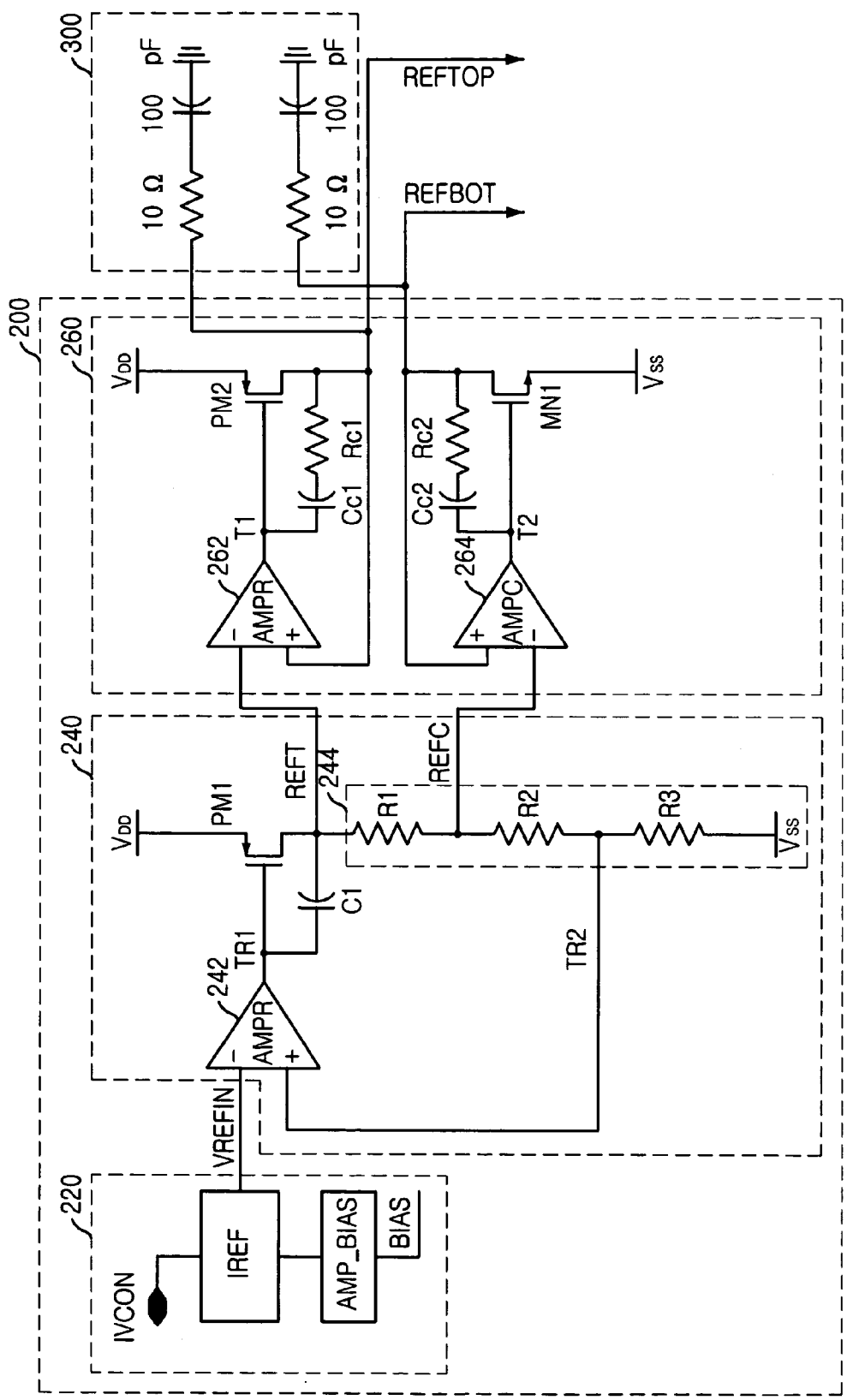
FIG. 3 is a schematic circuit diagram describing an on-chip reference voltage generator and an RC filter shown in FIG. 2.

FIG. 3 is a schematic circuit diagram describing the on-chip reference voltage generator 200 and the on-chip RC filter 300 shown in FIG. 2.

As shown, the on-chip reference voltage generator 200 includes an initial voltage generator 220 for generating an initial voltage VREFIN, a voltage level shifter 240 for generating reference voltages REFT and REFC by shifting a level of the initial voltage VREFIN and a voltage driver 260 for outputting the stabilized reference voltages REFTOP and REFBOT to the conversion unit 100 by stabilizing the reference voltages REFT and REFC.

The on-chip RC filter 300 coupled between the on-chip reference voltage generator 200 and the conversion unit 100 includes two pairs of a resistors and capacitors serially connected to each other.

In detail, the voltage level shifter 240 includes a first voltage inducing block 242 for receiving the initial voltage VREFIN and inducing an induced voltage TR2, a first driving block PM1 for supplying an operating current and a voltage dividing block 244 for outputting the reference voltages REFT and REFC based on the induced voltage TR2 and the operating current. The voltage level shifter 240 further includes a first capacitor C1 coupled between the voltage inducing block 242 and the voltage dividing block 244 for stabilizing the reference voltages REFT and REFC.

In addition, the voltage driver 260 includes a first driving unit for outputting the first stabilized reference voltage REFTOP by stabilizing the first reference voltage REFT and a second driving unit for outputting the second stabilized reference voltage REFBOT by stabilizing the second reference voltage REFC.

The on-chip reference voltage generator 200 includes the operational steps of generating the initial voltage VREFIN; generating the first and second reference voltages REFT and REFC by adjusting level of an induced voltage in response to the initial voltage VREFIN; and outputting the first and second stabilized reference voltages REFTOP and REFBOT by stabilizing the first and second reference voltages REFT and REFC.

Figure 4:
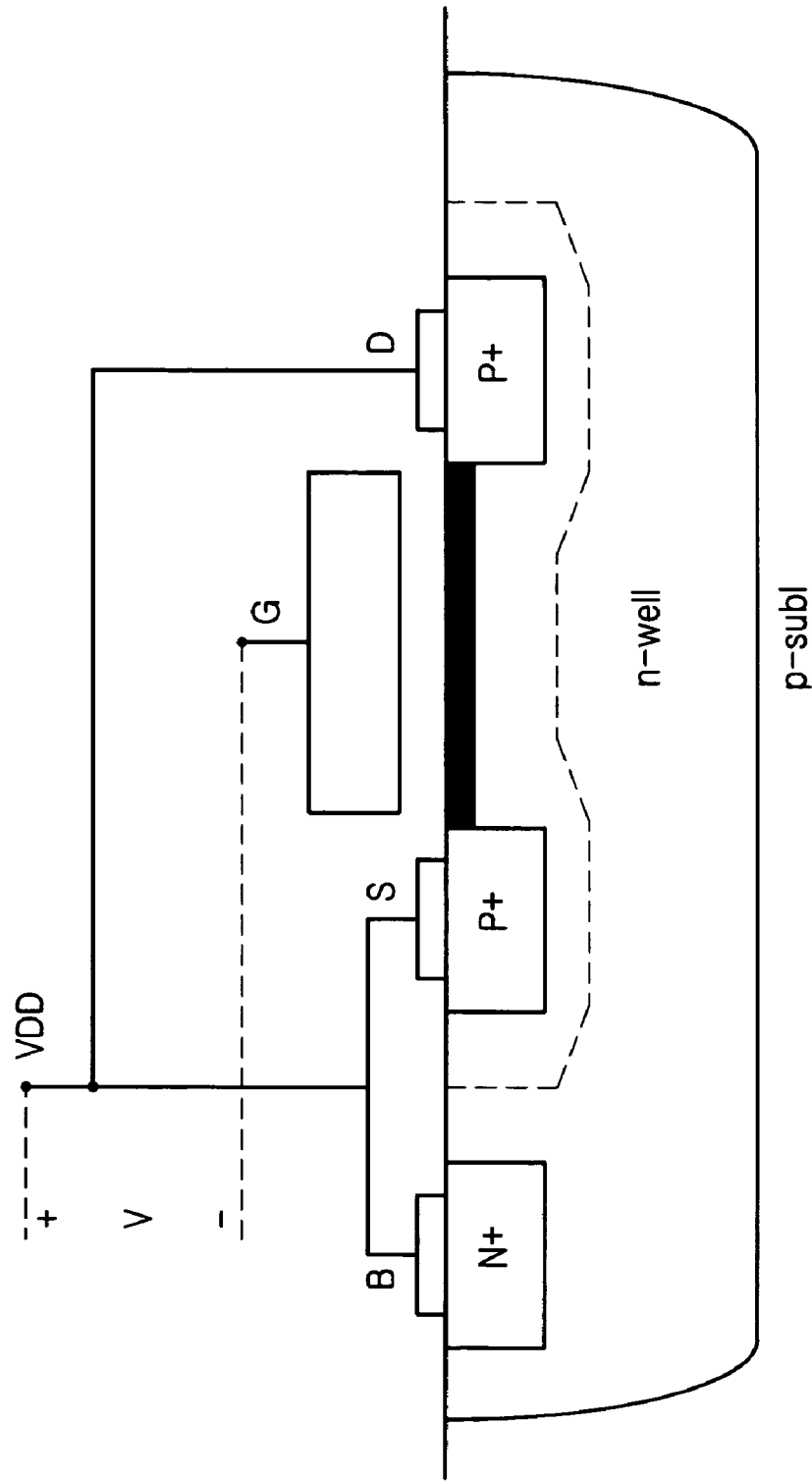
FIG. 4 is a capacitor included in the RC filter shown in FIG. 3.

FIG. 4 is a filtering capacitor included in the on-chip RC filter 300 shown in FIG. 3.

As shown, the filtering capacitor is implemented by a PMOS transistor. Gate G of the PMOS transistor is one side of the filtering capacitor, and source S, drain D and body B as the other side of the filtering capacitor are coupled to the supply voltage VDD. Herein, for decreasing a body effect of the PMOS transistor, the source S and the drain D of the filtering capacitor are connected to the body B of the filtering capacitor. In compared with a general capacitor having a metal-insulator-metal (MIM) structure, the filtering capacitor of the present invention using the PMOS transistor can have a larger capacitance versus its size.

Figure 5:
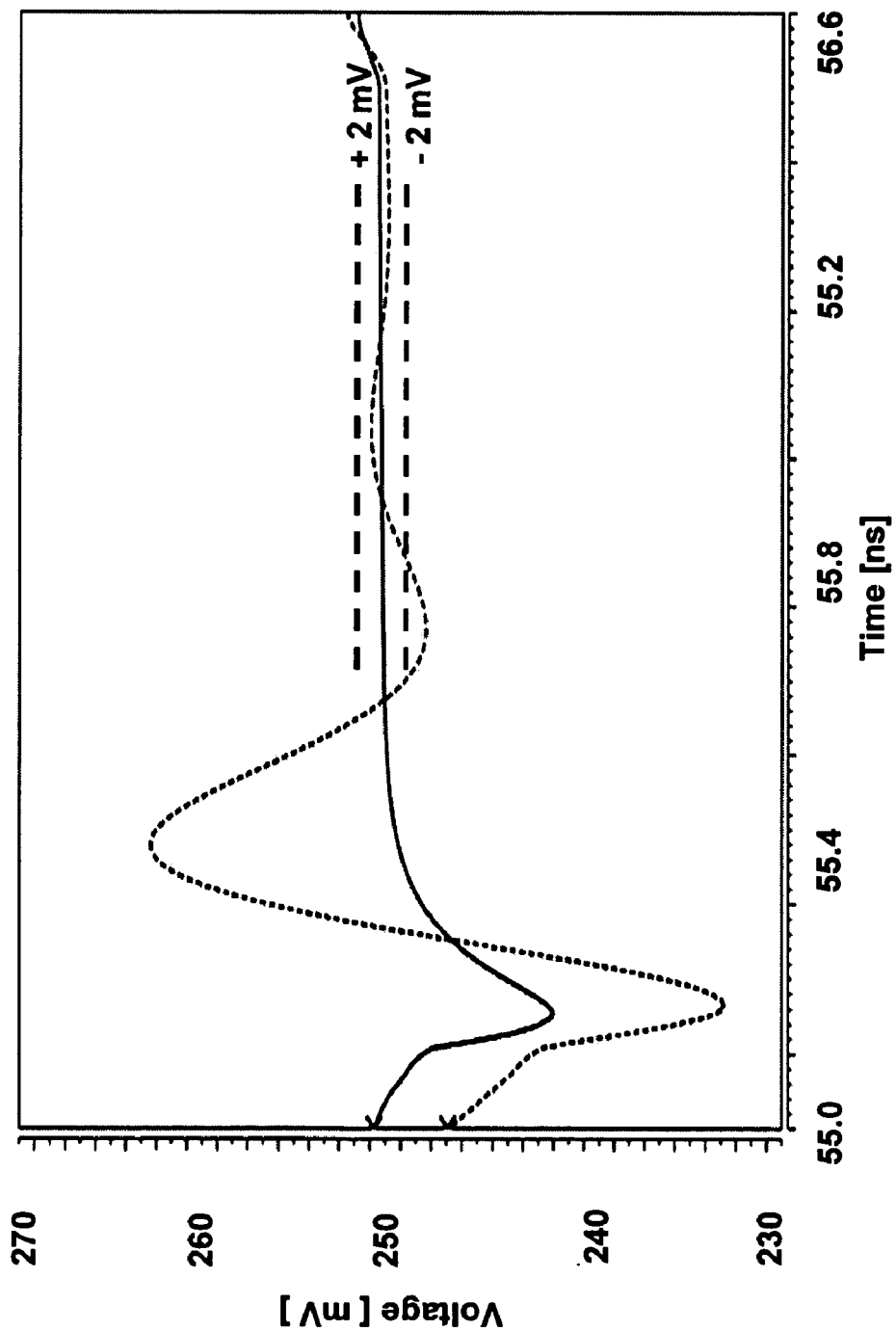
FIG. 5 is a waveform demonstrating a simulation result of the on-chip reference voltage generator and the RC filter shown in FIG. 2.

FIG. 5 is a graph demonstrating a simulation result of the on-chip reference voltage generator 200 and the on-chip RC filter 300 shown in FIG. 2.

As shown, time is the value of a coordinate on an x-axis of the graph (unit is ns) and the reference voltage is the value of a coordinate on a y-axis of the graph (unit is mV). In the graph, there are a solid line and a dotted line: the solid line is the reference voltage of the present invention; and the dotted line is the reference voltage of the prior art.

Two different circuits operating at the speed of 220 MS/s are simulated and compared. The conventional ADC has 0.1 uF off-chip bypass capacitors at reference voltage output nodes and the ADC of the present invention has the on-chip RC filter 300 connected to the reference voltage output nodes. As illustrated in FIG. 4, a settling time of the circuit with the on-chip RC filter 300 is 0.45 ns which can be corresponding to the higher sampling rate than 400 MS/s. However, the settling time with the 0.1 uF off-chip capacitors at the reference outputs get clearly much longer. Bonding pads based on this specific package are assumed to have the parasitic inductance and capacitance of 2.5 nH and 0.7 pF, respectively. Herein, the settling time is defined as a time needed for stabilizing the reference voltage in the range of ±2 mV.

Figure 6:
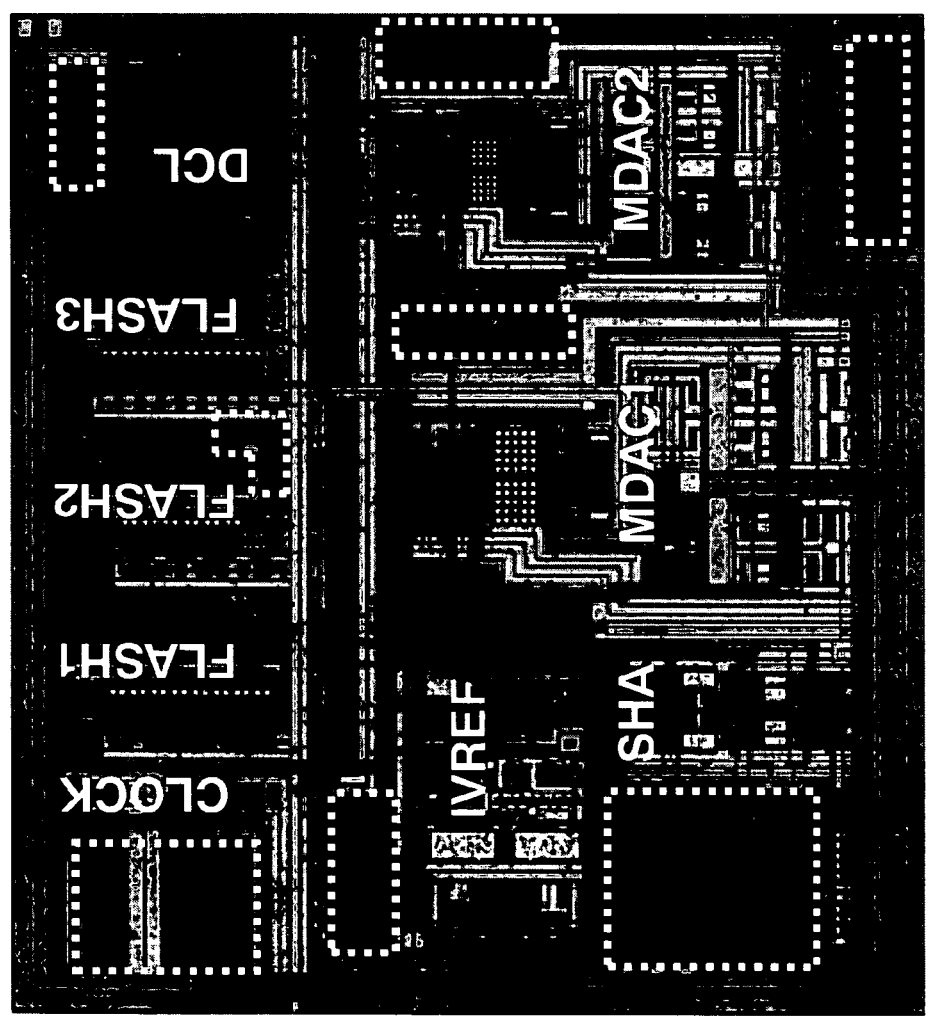
FIG. 6 is a chip of the ADC in accordance with an embodiment of the present invention.

FIG. 6 is a chip of an ADC in accordance with an embodiment of the present invention.

The ADC in accordance with an embodiment of the present invention is fabricated in a 0.25 um n-well single-poly, five-metal CMOS process. The die photograph of the ADC is shown in FIG. 6. The on-chip PMOS decoupling capacitors between circuit blocks are indicated by the bold dotted lines.

The ADC in accordance with the embodiment of the present invention employs a MCS technique in the 3b MDACs for having low power consumption and low noise at high speed. The MCS technique reduces the required MDAC unit capacitors from 8 to 4 by merging two unit capacitors into a single capacitor based on the equal charge redistribution concept. When using the same unit capacitor size as a conventional MDAC, the SHA and the MDAC improve the amplifying speed without increasing power consumption by reducing the load capacitances of the SHA and the number of the interconnection lines and the required devices in the MDAC by 50%. The unit capacitor sizes in the first and the second 3b MDACs are 100 fF and 50 fF, respectively, considering power consumption, resolution, kT/C noise, and 8b matching. The MDACs are based on a two-stage amplifier constituting with a folded-cascode and an unfolded-cascode architectures in the first and second stages, respectively, with the DC gain of 70 dB. The −3 dB frequencies of the first and second MDACs are 562 MHz and 477 MHz, respectively. The ADC occupies the active die area of 2.25 mm² and dissipates 220 mW at 2.5 V and 220 MS/s.

Figure 7:
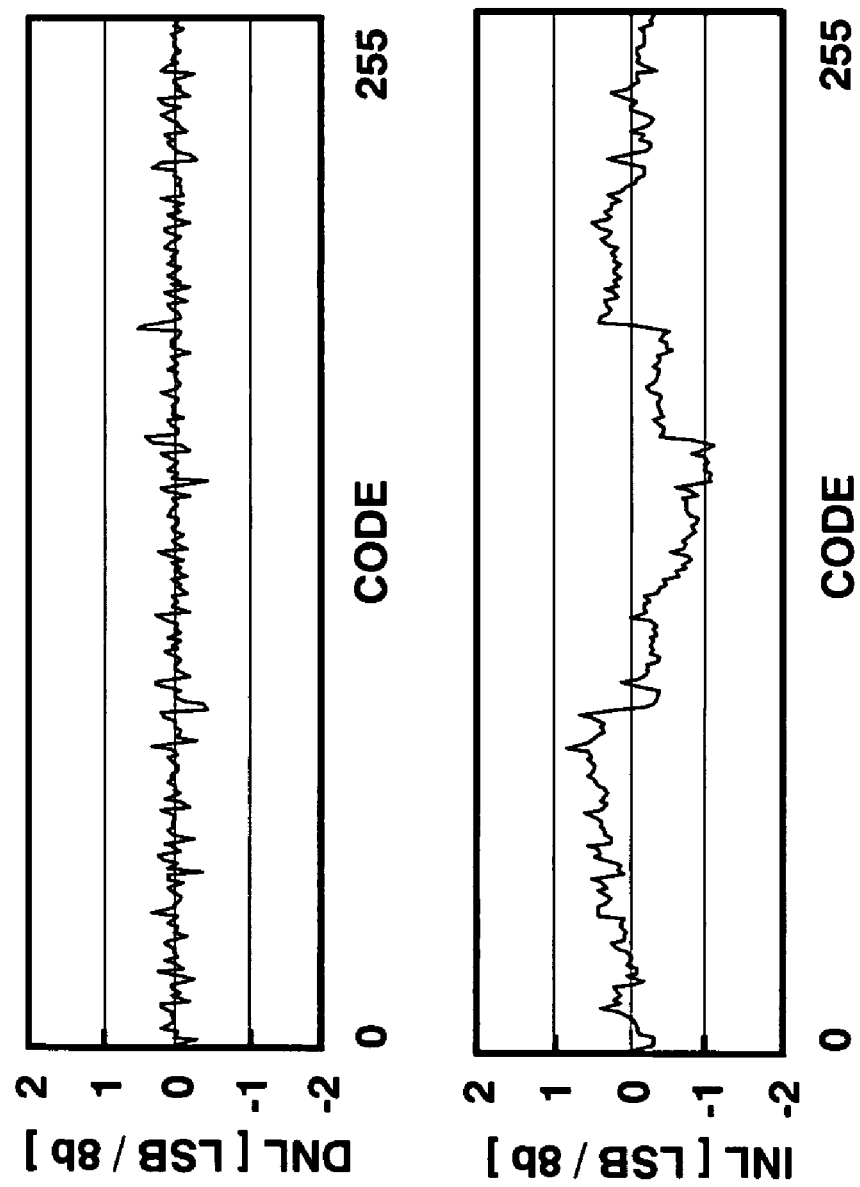
FIG. 7 is a waveform showing a differential nonlinearity DNL and an integral nonlinearity INL of the chip shown in FIG. 6.

FIG. 7 is a waveform showing a differential nonlinearity DNL and an integral nonlinearity INL of the chip shown in FIG. 6. As illustrated, the measured DNL and INL are within −0.44 to +0.43 LSB and −1.13 to +0.83 LSB.

Figure 8:
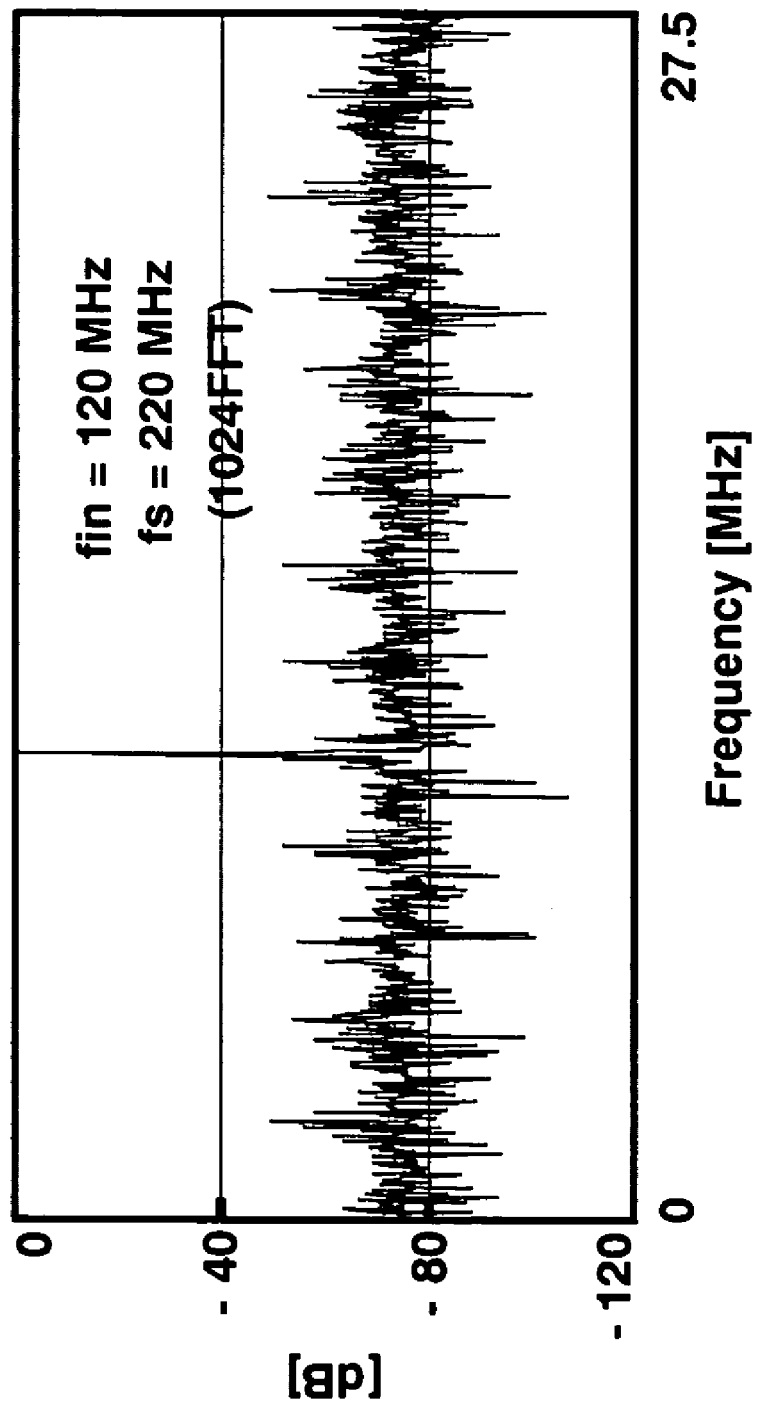
FIG. 8 is a spectrum describing a digital code outputted from the chip shown in FIG. 6.

FIG. 8 is a spectrum describing a digital code outputted from the chip shown in FIG. 6.

As shown, the spectrum measured with a 120 MHz analog sine wave at 220 MS/s is plotted. The output digital data are captured at the quarter rate (¼) of the 220 MHz clock with the on-chip decimator circuits. It is noted that the ADC itself is operating at the full speed of 220 MS/s.

Figure 9A:
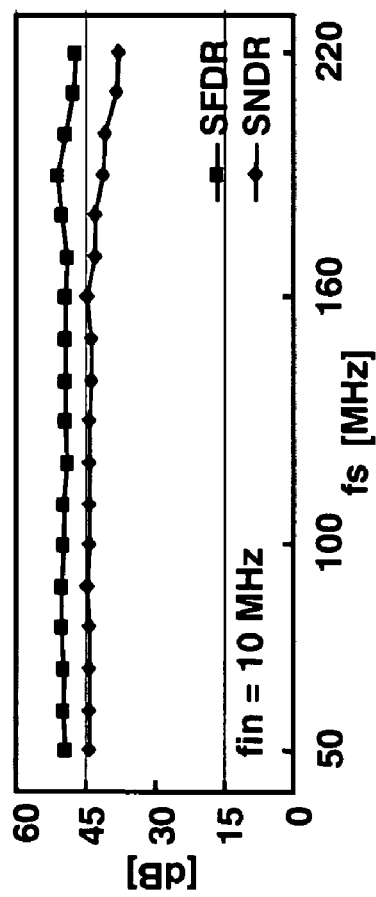
FIGS. 9A and 9B are waveforms depicting each spurious free dynamic range SFDR and signal to noise and distortion ratio SNDR of the chip, shown in FIG. 6, per a sampling frequency and a frequency of an inputted signal.
Figure 9B:
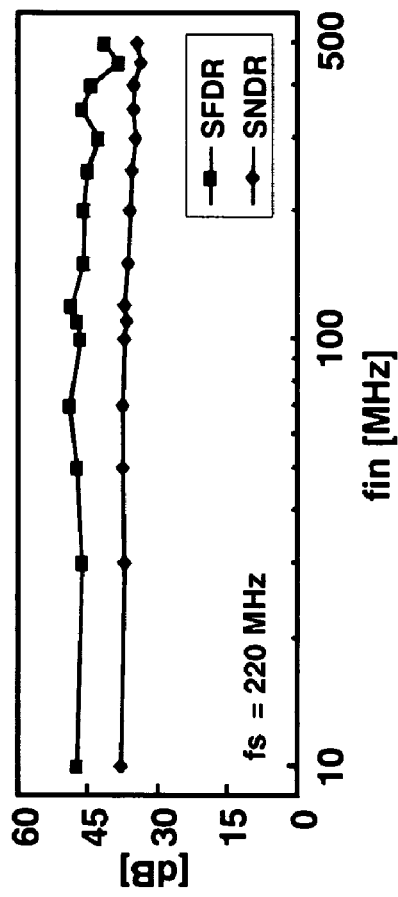

FIGS. 9A and 9B are graphs depicting each spurious free dynamic range SFDR and signal to noise and distortion ratio SNDR of the chip, shown in FIG. 6, per a frequency of a sampling frequency and an inputted signal.

When the sampling rate is increased from 50 MS/s to 220 MS/s, the SNDR and the spurious-free dynamic range (SFDR) with a 10 MHz differential input sine wave are shown in FIG. 9A. The SNDR is maintained above 40 dB when the sampling frequency increases up to 200 MS/s. The SNDR decreases from 41 dB to 38 dB by 3 dB with a 10 MHz input at the maximum operation sampling rate of 220 MS/s. The actual dynamic performance of the ADC at the maximum operating frequency is expected to be better, considering the parasitic capacitance and inductance components in bonding wire lines whose horizontal and vertical lengths are 1.1 mm and 1.2 mm in this current packaged version, respectively. Since the proposed ADC will be integrated as one of several important core macro cells for a relatively big system and will have short input and output interconnection lines, such long bonding wire problems as observed in this multi-project wafer (MPW) based package will rarely happen.

The SNDR and the SFDR in FIG. 9B are measured with increasing input frequencies at the maximum sampling frequency of 220 MS/s. With the input frequencies increased to a Nyquist frequency, the SNDR and the SFDR are maintained over 37 dB and 49 dB, respectively. The measured performance of the ADC in accordance with the present invention is summarized in Table 1.

TABLE 1

Performance summary of the ADC in accordance with the present invention

| | Resolution | 8 bits |
|---|---|---|
| | Max. Rate | 220 MS/s |
| | Process | 0.25 um CMOS |
| | Input Range | 1 $V_{p-p}$ |
| SNDR | at 200 MS/s | 40.8 dB at 10 MHz, 40.1 dB at 120 MHz, 37.4 dB at 500 MHz |
| | at 220 MS/s | 38.0 dB at 10 MHz, 36.9 dB at 120 MHz, 34.3 dB at 500 MHz |
| SFDR | at 200 MS/s | 49.5 dB at 10 MHz, 49.3 dB at 120 MHz, 47.2 dB at 500 MHz |
| | at 220 MS/s | 47.3 dB at 10 MHz, 48.6 dB at 120 MHz, 41.4 dB at 500 MHz |
| | DNL | −0.44 LSB/+0.43 LSB |
| | INL | −1.13 LSB/+0.83 LSB |
| | ADC Core Power | 220 mW at 220 MS/s |
| | Active Die Area | 2.25 mm² (= 1.5 mm × 1.5 mm) |

Figure 10:
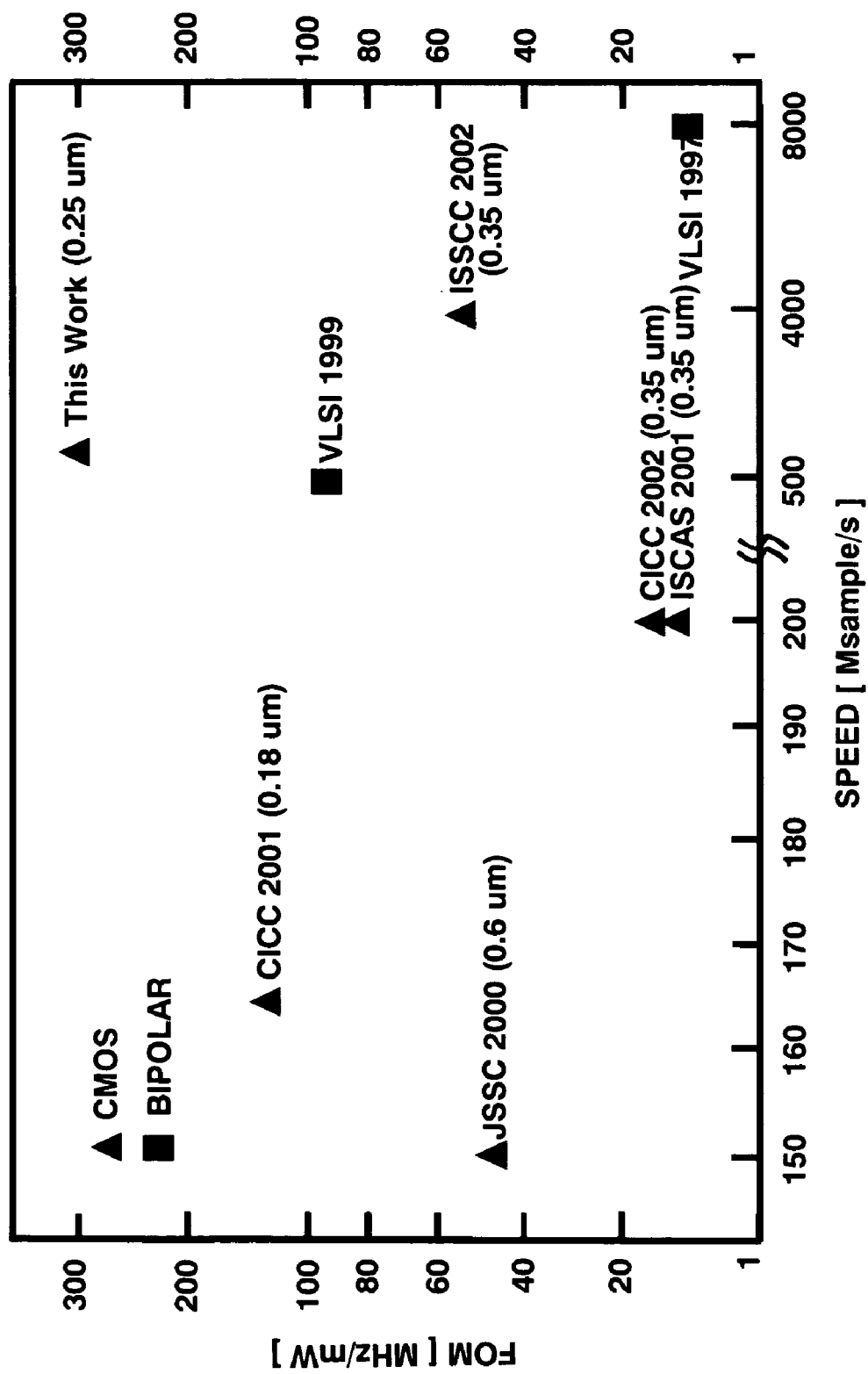
FIG. 10 is a graph showing a performance of the ADC in accordance with the present invention as compared with other ADCs.

FIG. 10 is a graph showing the performance of the ADC in accordance with the present invention as compared with other ADCs.

As shown, an ADC using a bipolar transistor consumes large power and an ADC using a CMOS transistor of the prior art can not be fabricated with one chip. However, the ADC in accordance with the present invention can impound all of component in the one chip and have advantages of an operating speed, a size and power consumption. Herein, the figure of merit (FoM) which is the value of a coordinate on a y-axis of the graph is defined as a following equation.

$$FOM = (2 \times ERBW) \times 2^{ENOB}/POWER \text{ (unit: MHz/mW)} \quad \text{Eq. 1}$$

In the Eq. 1, the effective resolution bandwidth (ERBW) is the input frequency where the signal-to-noise ratio (SNR) decreases by 3 dB below the SNR at low input frequencies and the ENOB represents the effective number of bits of the ADCS.

Consequently, the analog to digital converter (ADC) having the on-chip reference voltage generator and the on-chip RC filter can effectively remove a noise or a glitch by impounding the on-chip reference voltage generator and the on-chip RC filter in a chip of the analog to digital converter.

As described above, the on-chip reference voltage generator and the on-chip RC filter in accordance with the present invention are applied to the ADC. However, the present invention can be employed to a semiconductor device using a reference voltage, e.g., a digital to analog converter DAC, a filter and so on.

While the present invention has been described with respect to the particular embodiments, it will be apparent to those skilled in the art that various changes and modification may be made without departing from the spirit and scope of the invention as defined in the following claims.

What is claimed is:

1. A analog to digital converter implemented in one chip, comprising:

an on-chip reference voltage generator for generating N number of reference voltages, N being a positive integer; and a conversion means for converting the inputted analog signal into a digital signal by using the reference voltages, wherein the on-chip reference voltage generator includes a voltage driver for stabilizing the reference voltages.

2. The analog to digital converter as recited in claim 1, wherein the on-chip reference voltage generator includes:
an initial voltage generator for generating an initial voltage; and
a voltage level shifter for generating the reference voltages having N voltage levels by shifting a voltage level of the initial voltage.

3. The analog to digital converter as recited in claim 2, wherein the voltage level shifter includes:
a first voltage inducing block for receiving the initial voltage to generate an induced voltage;
a voltage dividing block for outputting the reference voltages by shifting a voltage level of the induced voltage as the voltage level of the initial voltage referenced on an operating current; and
a first driving block for generating the operating current to the voltage shifting block.

4. The analog to digital converter as recited in claim 3, wherein the voltage shifting block includes a plurality of resistors serially connected between the voltage driving block and a ground voltage.

5. The analog to digital converter as recited in claim 4, wherein the reference voltages are determined by the driving block and the voltage dividing block.

6. The analog to digital converter as recited in claim 5, wherein the voltage driver includes:
a first driving unit for stabilizing the first reference voltage; and
a second driving unit for stabilizing the second reference voltage.

7. The analog to digital converter as recited in claim 6, wherein the second driving block includes a MOS transistor coupled to the supply voltage and the first resistor, its gate being coupled to the second voltage inducing block.

8. The analog to digital converter as recited in claim 7, wherein the second driving unit includes:
a third voltage inducing block for receiving the second reference voltage and inducing the second reference voltage;
a third driving block connected to a ground voltage for stabilizing the second reference voltage to output the stabilized second voltage as the second reference voltage;
a third capacitor coupled between the third voltage inducing block and the third driving block for stabilizing the second reference voltage; and
a second resistor coupled between the third voltage inducing block and the third driving block for stabilizing the second reference voltage.

9. The analog to digital converter as recited in claim 8, wherein the third voltage inducing block includes
a differential amplifier for inducing the second reference voltage by a current mirror.

10. The analog to digital converter as recited in claim 9, wherein the second driving block includes
a MOS transistor coupled to the ground voltage and the second resistor, its gate being coupled to the third voltage inducing block.

11. The analog to digital converter as recited in claim 6, wherein the first driving unit includes:
a second voltage inducing block for receiving the first reference voltage to generate a first voltage;
a second driving block connected to a supply voltage for stabilizing the first voltage to output the stabilized first voltage as the first reference voltage;
a second capacitor coupled between the second voltage inducing block and the second driving block for stabilizing the first voltage; and
a first resistor coupled between the second voltage inducing block and the second driving block for stabilizing the first reference voltage.

12. The analog to digital converter as recited in claim 11, wherein the second voltage inducing block includes a differential amplifier for generating the first voltage.

13. The analog to digital converter as recited in claim 5, wherein the reference voltages are divided into first and second reference voltages.

14. The analog to digital converter as recited in claim 3, wherein the voltage level shifter includes a first capacitor coupled between the voltage inducing block and the voltage dividing block for stabilizing the reference voltages.

15. The analog to digital converter as recited in claim 3, wherein the first voltage inducing block includes a differential amplifier for generating the induced voltage.

16. The analog to digital converter as recited in claim 3, wherein the first driving block includes a MOS transistor coupled to a supply voltage and the voltage dividing block, its gate being coupled to the first voltage inducing block.

17. The analog to digital converter as recited in claim 1, further comprising M number of filters coupled between the on-chip reference voltage generator and the conversion means for removing noise contained in the reference voltages, M being a positive integer.

18. The analog to digital converter as recited in claim 17, wherein the filters are RC filters.

19. The analog to digital converter as recited in claim 18, wherein the RC filter includes a capacitor embodied by a MOS transistor, its gate being served as one side of the capacitor and its source, drain and body being served as the other side of the capacitor.

20. The analog to digital converter as recited in claim 1, wherein the on-chip reference voltage generator includes a voltage level shifter for use in generating the reference voltages.

21. A system having one chip analog to digital converter, comprising:
an on-chip reference voltage generator contained in the analog to digital converter for generating N number of reference voltages, N being a positive integer; and
a conversion means contained in the analog to digital converter for converting the inputted analog signal into a digital signal by using the reference voltages.
wherein the on-chip reference voltage generator includes a voltage driver for stabilizing the reference voltages.

22. The system as recited in claim 21, wherein the on-chip reference voltage generator includes:
an initial voltage generator for generating an initial voltage; and
a voltage level shifter for generating the reference voltages having N voltage levels by shifting a voltage level of the initial voltage.

23. The system as recited in claim 22, wherein the voltage level shifter includes:
a first voltage inducing block for receiving the initial voltage to generate an induced voltage;

a voltage dividing block for outputting the reference voltages by shifting a voltage level of the induced voltage as the voltage level of the initial voltage referenced on an operating current; and a first driving block for generating the operating current to the voltage shifting block.

24. The system as recited in claim 23, wherein the voltage shifting block includes a plurality of resistors serially connected between the voltage driving block and a ground voltage.

25. The system as recited in claim 24, wherein the filters are RC filters.

26. The system as recited in claim 25, wherein the RC filter includes a capacitor embodied by a MOS transistor, its gate being served as one side of the capacitor and its source, drain and body being served as the other side of the capacitor.

27. The system as recited in claim 21, wherein the on-chip reference voltage generator includes a voltage level shifter for use in generating the reference voltages.

28. The system as recited in claim 21, further comprising M number of filters coupled between the on-chip reference voltage generator and the conversion means for removing noise contained in the reference voltages, M being a positive integer.

* * * * *